US012610723B2

(12) United States Patent
Gai et al.

(10) Patent No.: US 12,610,723 B2
(45) Date of Patent: Apr. 21, 2026

(54) DISPLAY SUBSTRATE HAVING REFLECTION REDUCING STRUCTURE, PREPARATION METHOD THEREOF AND DISPLAY APPARATUS

(71) Applicant: BOE TECHNOLOGY GROUP CO., LTD., Beijing (CN)

(72) Inventors: Renrong Gai, Beijing (CN); Xueyan Tian, Beijing (CN); Tao Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 478 days.

(21) Appl. No.: 18/029,135

(22) PCT Filed: May 20, 2022

(86) PCT No.: PCT/CN2022/094144
§ 371 (c)(1),
(2) Date: Mar. 29, 2023

(87) PCT Pub. No.: WO2023/221097
PCT Pub. Date: Nov. 23, 2023

(65) Prior Publication Data
US 2024/0365648 A1 Oct. 31, 2024

(51) Int. Cl.
*H10K 59/80* (2023.01)
*H10K 59/12* (2023.01)
*H10K 59/122* (2023.01)

(52) U.S. Cl.
CPC ..... *H10K 59/8792* (2023.02); *H10K 59/1201* (2023.02); *H10K 59/122* (2023.02); *H10K 59/873* (2023.02)

(58) Field of Classification Search
None
See application file for complete search history.

(56) References Cited

U.S. PATENT DOCUMENTS 11,183,549 B2 11/2021 Fang et al.
2015/0185539 A1* 7/2015 Senokuchi ............ G02F 1/1339
257/40

(Continued)

FOREIGN PATENT DOCUMENTS

CN 109285858 A 1/2019
CN 110224008 A 9/2019
CN 110993658 A 4/2020

*Primary Examiner* — Nduka E Ojeh
(74) *Attorney, Agent, or Firm* — HOUTTEMAN LAW LLC

(57) ABSTRACT

A display substrate, including: a base; a pixel driving circuit and a light-emitting unit sequentially stacked on the base. The light-emitting unit includes a top emission element and a bottom emission element; the top emission element emits light from a side away from the pixel driving circuit; the bottom emission element emits light from a side close to the pixel driving circuit; orthographic projections of an effective light-emitting region of the top emission element and an effective light-emitting region of the bottom emission element on the base do not overlap with each other. The display substrate further includes a reflection reducing structure on a side of the light-emitting unit away from the pixel driving circuit, and an orthographic projection of the reflection reducing structure on the base covers at least the orthographic projection of the effective light-emitting region of the bottom emission element on the base.

18 Claims, 7 Drawing Sheets

A-A'

(56)        References Cited

U.S. PATENT DOCUMENTS

| | | | |
|---|---|---|---|
| 2016/0268362 A1* | 9/2016 | Shi | H10K 59/80518 |
| 2018/0149941 A1* | 5/2018 | Gu | G02F 1/1503 |
| 2019/0189727 A1* | 6/2019 | Kim | H10K 59/121 |
| 2021/0335962 A1* | 10/2021 | Fang | H10K 50/818 |

* cited by examiner

A–A'

A–A'

A-A'

A-A'

A-A'

DISPLAY SUBSTRATE HAVING REFLECTION REDUCING STRUCTURE, PREPARATION METHOD THEREOF AND DISPLAY APPARATUS

TECHNICAL FIELD

Embodiments of the present disclosure belong to the field of display technology, and specifically relate to a display substrate, a preparation method thereof, and a display apparatus.

BACKGROUND

In the flat panel display technology, due to many advantages including lightness, thinness, active light emission, fast response speed, wide viewing angle, rich colors, high brightness, low power consumption, high and low temperature resistance, and the like, the organic light-emitting diode (OLED) display product is considered as the third generation display technology following the liquid crystal display (LCD) product.

SUMMARY

Embodiments of the present disclosure provide a display substrate, a preparation method thereof, and a display apparatus.

In a first aspect, an embodiment of the present disclosure provides a display substrate, including: a base;

a pixel driving circuit and a light-emitting unit sequentially stacked on the base; wherein the light-emitting unit comprises a top emission element and a bottom emission element, the top emission element is configured to emit light from a side of the top emission element facing away from the pixel driving circuit, the bottom emission element is configured to emit light from a side of the bottom emission element close to the pixel driving circuit, orthographic projections of an effective light-emitting region of the top emission element and an effective light-emitting region of the bottom emission element on the base do not overlap with each other; and the display substrate further includes a reflection reducing structure on a side of the light-emitting unit facing away from the pixel driving circuit, and an orthographic projection of the reflection reducing structure on the base covers at least the orthographic projection of the effective light-emitting region of the bottom emission element on the base.

In some embodiments, the bottom emission element includes a first electrode, a first light-emitting functional layer, and a second electrode which are sequentially stacked in a direction away from the pixel driving circuit; and the reflection reducing structure includes a first film layer on a side of the second electrode facing away from the first light-emitting functional layer, and the first film layer correspondingly covers the effective light-emitting region of the bottom emission element.

In some embodiments, the display substrate further includes a package layer on a side of the light-emitting unit facing away from the pixel driving circuit; wherein the package layer includes a first inorganic layer, an organic layer and a second inorganic layer which are sequentially stacked in a direction away from the light-emitting unit;

the first film layer is located on a side of the first inorganic layer facing away from the second electrode, and a side of the organic layer close to the first inorganic layer.

In some embodiments, the reflection reducing structure further includes a second film layer on a side of the first film layer facing away from the light-emitting unit; and the second film layer correspondingly covers the effective light-emitting region of the bottom emission element.

In some embodiments, the second film layer is in contact with the first film layer.

In some embodiments, the top emission element is adjacent to the bottom emission element; a display region of the top emission element has a maximum viewing angle θ;

the first film layer is in contact with the second electrode, an orthographic projection of the first film layer on the base falls into an orthographic projection of the second electrode on the base, and an orthographic projection of the first film layer on the base has an area smaller than the orthographic projection of the second electrode on the base;

a distance d is provided between an orthographic projection of the first film layer on the base and an orthographic projection of a side edge of the second electrode close to the top emission element on the base, and the first film layer reaches a lowest reflectivity at a thickness "a"; and θ and d satisfy: $\tan(90° - θ/2) = a/d$; where $120° \leq θ \leq 180°$.

In some embodiments, the top emission element is adjacent to the bottom emission element; a display region of the top emission element has a maximum viewing angle θ;

an orthographic projection of the first film layer on the base falls into an orthographic projection of the second electrode on the base, and an orthographic projection of the first film layer on the base has an area smaller than the orthographic projection of the second electrode on the base;

a distance e is provided between an orthographic projection of the first film layer on the base and an orthographic projection of a side edge of the second electrode close to the top emission element on the base, the first film layer reaches a lowest reflectivity at a thickness "a", and the first inorganic layer has a thickness b; and θ and e satisfy: $\tan(90° - θ/2) = (a+b)/e$; where $120° \leq θ < 180°$.

In some embodiments, "a" is in a range of 1500 nm to 2500 nm, and d is in a range of 2600 nm to 4500 nm.

In some embodiments, "a" is in a range of 1500 nm to 2500 nm, and e is in a range of 2946 nm to 4700 nm.

In some embodiments, the display substrate further includes a display region where the light-emitting unit is located; wherein the display substrate further comprises a pixel defining layer on a side of the pixel driving circuit facing away from the base, the pixel defining layer is provided with a plurality of openings formed therein, and the top emission element and the bottom emission element are respectively located in different ones of the openings, and an orthographic projection of the reflection reducing structure on the base covers all regions in the display region except the opening where the top emission element is located.

In some embodiments, the display substrate further includes a display region where the light-emitting unit is located; wherein the reflection reducing structure has a grid shape; and an orthographic projection of the reflection reducing structure on the base covers the entire display region.

In some embodiments, the first film layer is made of a material including any one of MoOx with Ta added, MoOx with ZnO added, NbC with ZnO added, a black resin material, or a black photoresist material.

In some embodiments, the second film layer is made of a material including a black resin material or a black photoresist material.

In some embodiments, a plurality of top emission elements are provided; a plurality of bottom emission elements are provided;

the plurality of top emission elements are arranged adjacent to each other to form a top emission pixel; one or more top emission pixels are arranged adjacent to each other to form a top emission unit;

the plurality of bottom emission elements are arranged adjacent to each other to form a bottom emission pixel; one or more bottom emission pixels are arranged adjacent to each other to form a bottom emission unit;

top emission units and bottom emission units are alternately arranged in an array along a first direction and a second direction, respectively; and the first direction is a row direction of the array, and the second direction is a column direction of the array.

In a second aspect, an embodiment of the present disclosure further provides a display apparatus, including the display substrate as described above.

In a third aspect, an embodiment of the present disclosure further provides a method for preparing a display substrate, including:

sequentially preparing a pixel driving circuit and a light-emitting unit on a base; wherein the preparing the light-emitting unit comprises preparing a top emission element and a bottom emission element, and orthographic projections of the top emission element and the bottom emission element on the base do not overlap with each other; and the method further includes: preparing a reflection reducing structure after the light-emitting unit is prepared; wherein an orthographic projection of the reflection reducing structure on the base covers at least the orthographic projection of the effective light-emitting region of the bottom emission element on the base.

In some embodiments, the preparing the reflection reducing structure includes preparing a first film layer; and the preparing the first film layer includes:

forming a pattern of a sacrificial layer on the base on which the light-emitting unit or the first inorganic layer has been prepared; wherein the pattern of the sacrificial layer correspondingly covers other regions than the effective light-emitting region of the bottom emission element;

depositing a film for forming the first film layer on the base after the forming of the pattern of the sacrificial layer is completed; and soaking, after the forming of the pattern of the sacrificial layer and the depositing of the film for forming the first film layer are completed, the base in a stripping liquid, to separate the sacrificial layer from a film layer attached to the sacrificial layer and form a pattern of the first film layer, wherein the pattern of the first film layer correspondingly covers the effective light-emitting region of the bottom emission element.

In some embodiments, preparing the reflection reducing structure includes preparing a first film layer; and preparing the first film layer includes:

depositing a film for forming the first film layer on the base on which the light-emitting unit or the first inorganic layer is prepared; and forming a pattern of the first film layer through processes including photoresist coating, exposure, development and etching; wherein the pattern of the first film layer correspondingly covers the effective light-emitting region of the bottom emission element.

In some embodiments, preparing the reflection reducing structure includes preparing a first film layer; and preparing the first film layer includes:

coating a film for forming the first film layer on the base on which the light-emitting unit or the first inorganic layer is prepared; and forming a pattern of the first film layer through processes including exposure and development; wherein the pattern of the first film layer correspondingly covers the effective light-emitting region of the bottom emission element.

In some embodiments, preparing the reflection reducing structure further includes preparing a second film layer; and preparing the second film layer includes:

coating a film for forming the second film layer on the base on which the first film layer is prepared;

forming a pattern of the second film layer through processes including exposure and development; wherein the pattern of the second film layer correspondingly covers the effective light-emitting region of the bottom emission element.

BRIEF DESCRIPTION OF DRAWINGS

Accompanying drawings are provided for further understanding of the embodiments of the present disclosure and constitute a part of the specification, and are intended to explain the present disclosure together with the following embodiments, but should not be considered as a limitation to the present disclosure. The above and other features and advantages will become more apparent to those skilled in the art by describing in detail exemplary embodiments thereof with reference to the attached drawings, in which.

DETAIL DESCRIPTION OF EMBODIMENTS

Figure 1:
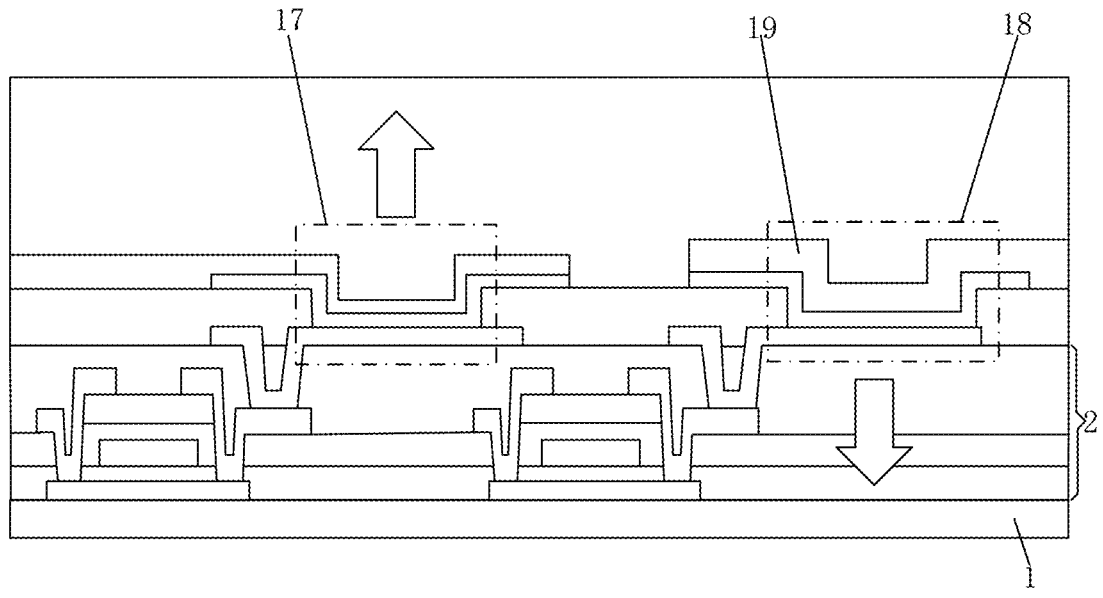
FIG. 1 is a schematic structural sectional view of a double-sided display panel in the disclosed art.

In order to make those skilled in the art better understand the technical solutions in the embodiments of the present disclosure, the display substrate, the preparation method thereof and the display apparatus provided in the embodiments of the present disclosure will be described in further detail below with reference to the accompanying drawings and specific implementations.

Embodiments of the present disclosure will be described more sufficiently below with reference to the accompanying drawings, which may be embodied in different forms and should not be construed as being limited to the embodiments set forth herein. Rather, these embodiments are provided so that the present disclosure will be thorough and complete, and will fully convey the scope of the present disclosure to those skilled in the art.

The embodiments of the present disclosure are not limited to the embodiments shown in the drawings, but further include modifications of configurations formed based on a manufacturing process. Thus, the regions illustrated in the figures have schematic properties, and the shapes of the regions shown in the figures illustrate specific shapes of regions, but are not intended to be limitative.

In the disclosed art, referring to FIG. 1, a schematic structural sectional view of a double-sided display panel in the disclosed art is shown. In a double-sided organic light-emitting display panel, a top emission organic light-emitting device 17 is used for front display, and a bottom emission organic light-emitting device 18 is used for back display. Since a pixel driving circuit 2 of an organic light-emitting device is located on a side of the light-emitting device close to a base 1, and the pixel driving circuit 2 shields a light-emitting region of the bottom emission organic light-emitting device 18 to some extent, the bottom emission organic light-emitting device 18 has a relatively low light-emitting efficiency, which is 1.5 to 2 times lower than that of the top emission organic light-emitting device 17, resulting in a large difference in light-emitting efficiency between the top emission organic light-emitting device 17 and the bottom emission organic light-emitting device 18, and thus a large difference in display brightness between the front and back surfaces of the double-sided display panel.

In the disclosed art, the bottom emission organic light-emitting device 18 uses a thicker aluminum film layer as a cathode 19, so as to improve a reflection extraction rate of the emitted light, and to increase a light-emitting efficiency of the bottom emission organic light-emitting device 18. Therefore, a thickness of the aluminum film layer for the cathode 19 of the bottom emission organic light-emitting device 18 is increased to 80 nm to 200 nm. With the increase of the thickness, the reflectivity of the aluminum film layer is increased, and thus a light-emitting rate of the bottom emission organic light-emitting device 18 is also increased, so that the difference in display brightness between the front and back surfaces of the double-sided display panel is reduced. However, as the thickness of the aluminum film layer is increased, the front surface reflectivity is also synchronously increased, causing increased reflection of ambient light by the bottom emission region on the front surface, which may cause an increased overall reflectivity of the front display, and since there is a relatively large difference in light reflectivity between the top emission region and the bottom emission region on the front surface, visible patterns may occur.

Figure 2:
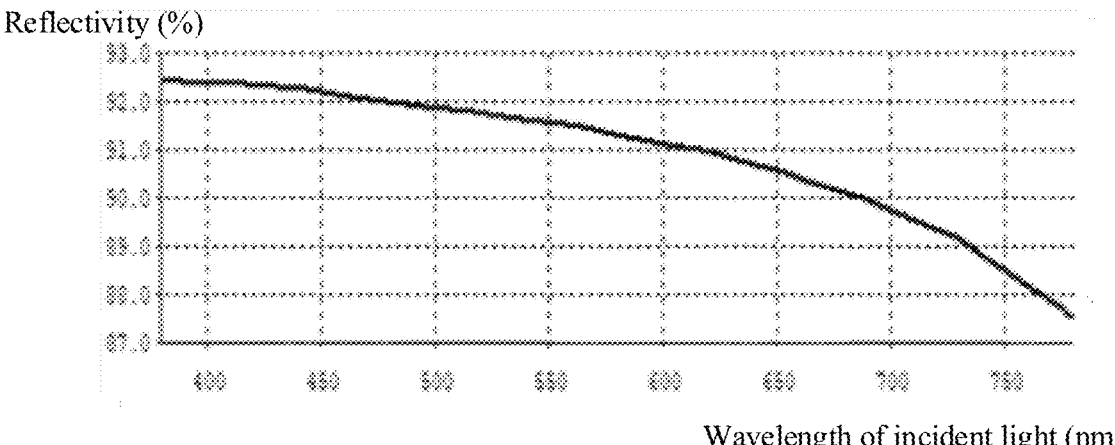
FIG. 2 is a graph showing reflectivity to different wavelengths of incident light of a cathode aluminum film layer with a relatively thick bottom emission organic light-emitting device in the disclosed art.
Figure 3:
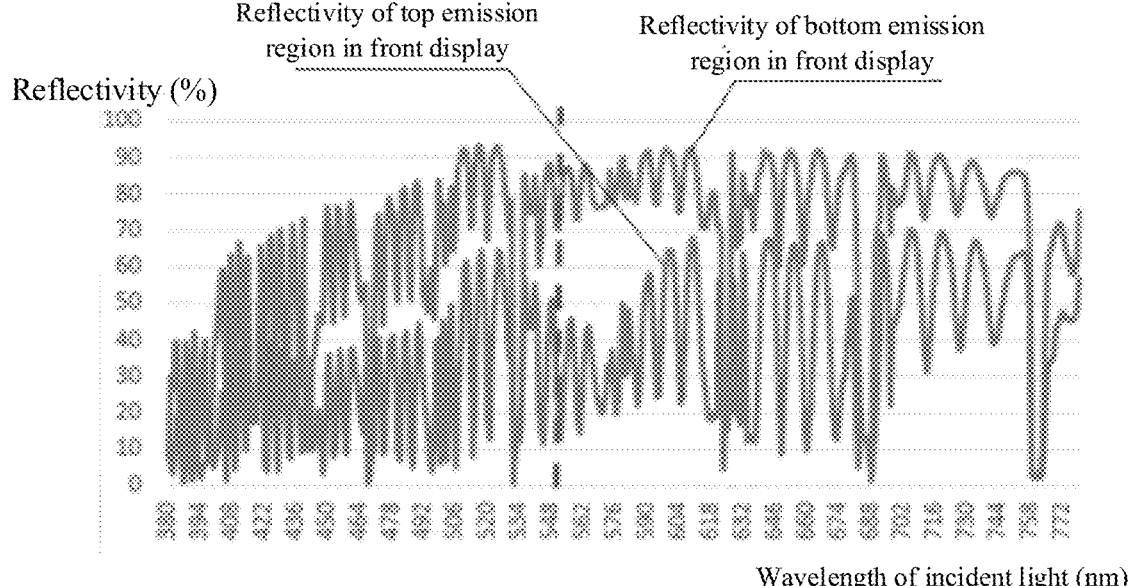
FIG. 3 is a graph showing a reflectivity comparison between a top emission region and a bottom emission region in front display of a double-sided display panel in the disclosed art.

Referring to FIGS. 2 and 3, FIG. 2 is a graph showing reflectivity to different wavelengths of incident light of a cathode aluminum film layer with a relatively thick bottom emission organic light-emitting device in the disclosed art, and FIG. 3 is a graph showing a reflectivity comparison between a top emission region and a bottom emission region in front display of a double-sided display panel in the disclosed art. Referring to FIG. 2, the thick aluminum film layer may have a reflectivity up to 91% for incident light with a wavelength of 550 nm, and due to the high reflectivity of the bottom emission region, increased ambient light is reflected by the bottom emission region on the front surface of the double-sided display panel. Referring to FIG. 3, experimental verification shows that a front display region (i.e., the top emission region) of the double-sided display panel has a reflectivity around 24.5%, the bottom emission region on the front surface has a reflectivity around 66.9% to ambient light, and in a case where the reflectivity to ambient light of the bottom emission region on the front surface is too high, an overall reflectivity of the front display may be too high, and the front display tends to be visible in a patterned manner.

Figure 4:
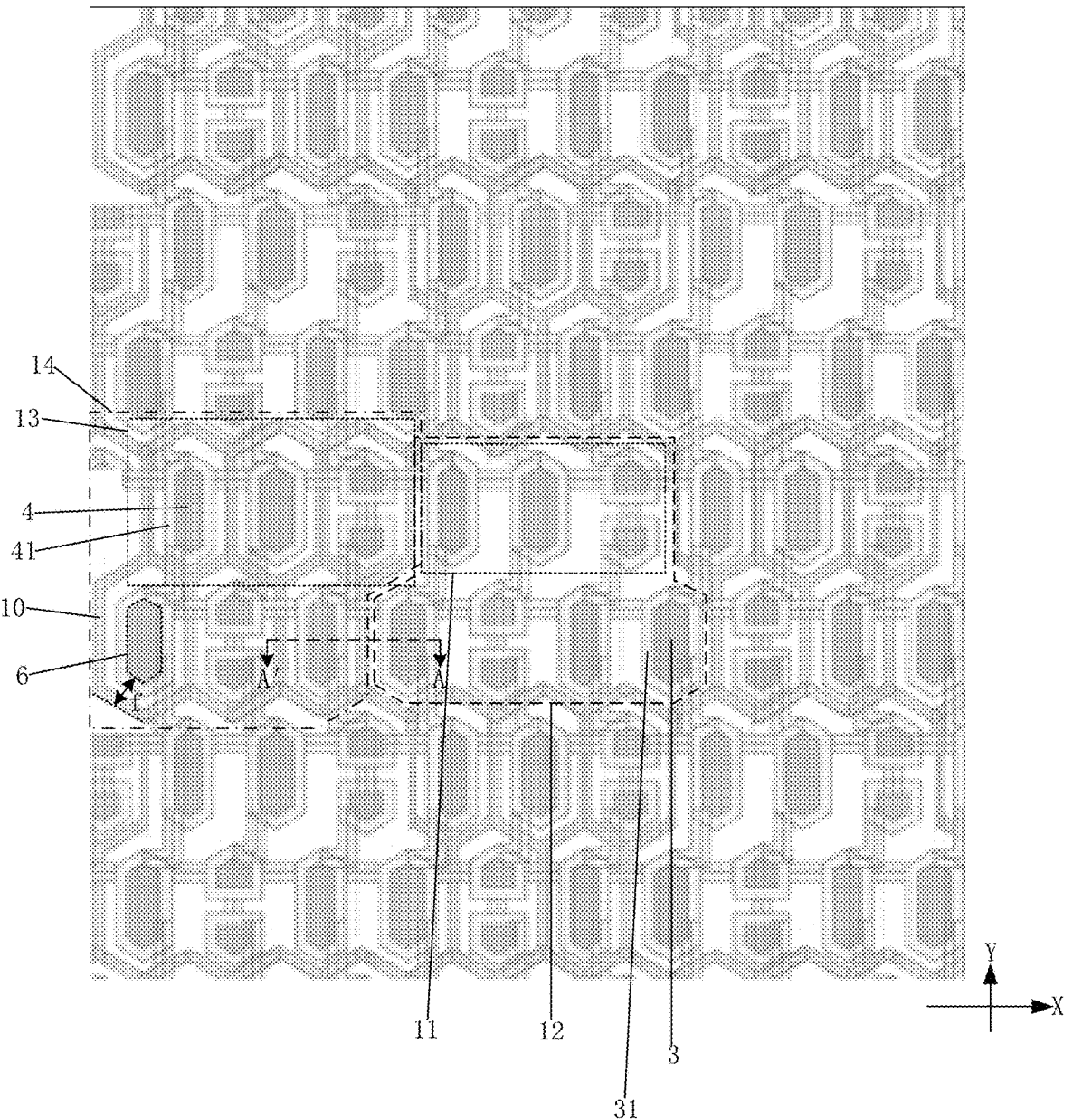
FIG. 4 is a schematic structural top view of a front surface of a display substrate according to an embodiment of the present disclosure.
Figure 5:
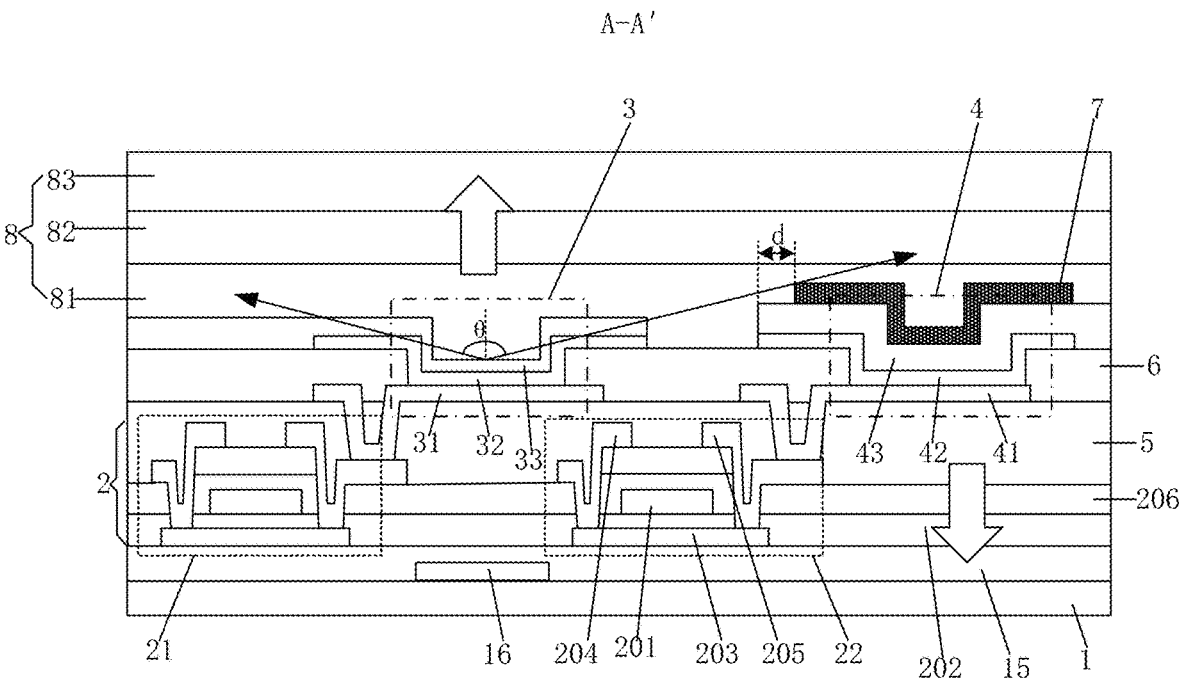
FIG. 5 is a structural sectional view of a display substrate taken along line AA' in FIG. 4 according to an embodiment of the present disclosure.

In view of the above problems, in a first aspect, an embodiment of the present disclosure provides a display substrate. Referring to FIG. 4, a schematic structural top view of a front surface of a display substrate according to an embodiment of the present disclosure is shown. FIG. 5 is a structural sectional view of a display substrate taken along line AA' in FIG. 4 according to an embodiment of the present disclosure. The display substrate includes: a base 1; and a pixel driving circuit 2 and a light-emitting unit sequentially stacked on the base 1. The light-emitting unit includes a top emission element 3 and a bottom emission element 4. The top emission element 3 emits light from a side of the top emission element 3 facing away from the pixel driving circuit 2. The bottom emission element 4 emits light from a side facing close to the pixel driving circuit 2. Orthographic projections of an effective light-emitting region of the top emission element 3 and an effective light-emitting region of the bottom emission element 4 on the base 1 do not overlap with each other. The display substrate further includes a reflection reducing structure 10 on a side of the light-emitting unit facing away from the pixel driving circuit 2, and an orthographic projection of the reflection reducing structure 10 on the base 1 covers at least the orthographic projection of the effective light-emitting region of the bottom emission element 4 on the base 1.

The top emission element 3 includes a third electrode 31, a second light-emitting functional layer 32, and a fourth electrode 33 which are sequentially stacked in a direction away from the pixel driving circuit 2. The bottom emission element 4 includes a first electrode 41, a first light-emitting functional layer 42, and a second electrode 43 which are sequentially stacked in a direction away from the pixel driving circuit 2. The pixel driving circuit 2 includes a first driving transistor 21 and a second driving transistor 22, each including a gate 201, a gate insulating layer 202, an active layer 203, a source 204 and a drain 205. The first driving transistor 21 and the second driving transistor 22 are both top gate transistors. Sources 204 and drains 205 of the first driving transistor 21 and the second driving transistor 22 are disposed in a same layer, and an intermediate dielectric layer 206 is further provided between the source 204 and the drain 205 and the gate 201. A planarization layer 5 is further provided between the pixel driving circuit 2 and the light-emitting unit. The third electrode 31 and the first electrode 41 are located on the planarization layer 5, a pixel defining layer 6 is further provided on a side of the third electrode 31 and the first electrode 41 away from the planarization layer 5, a plurality of openings are formed in the pixel defining layer 6, and the effective light-emitting regions of the top emission element 3 and the bottom emission element 4 are respectively located in different openings. The effective light-emitting region of the top emission element 3 refers to an orthographic projection overlap region of the third electrode 31, the second light-emitting functional layer 32 and the fourth electrode 33 on the base 1. The effective light-emitting region of the bottom emission element 3 refers to an orthographic projection overlap region of the first electrode 41, the first light-emitting functional layer 42 and the second electrodes 43 on the base 1. Only the effective light-emitting regions of the top emission element 3 and the bottom emission element 4 can emit light normally. The third electrode 31 is connected to the drain 205 of the first driving transistor 21 through a via formed in the planarization layer 5. The first electrode 41 is connected to the drain 205 of the second driving transistor 22 through a via formed in the planarization layer 5.

In some embodiments, the top emission element 3 emits light from a side of the fourth electrode 33 facing away from the base 1, and the bottom emission element 4 emits light from a side of the first electrode 41 close to the base 1. The light-emitting side of the top emission element 3 is defined as the front surface of the display substrate; and the light-emitting side of the bottom emission element 4 is defined as the back surface of the display substrate. Therefore, front and back display of the display substrate, i.e., double-sided display of the display substrate, is realized. In addition, on the front and back surfaces of the display substrate, a region corresponding to the top emission element 3 is defined as a top emission region; and a region corresponding to the bottom emission element 4 is defined as a bottom emission region. The third electrode 31 has a laminated structure of ITO, Ag, and ITO, and is opaque. The fourth electrode 33 is made of a mixture of Mg and Ag, and is light transparent. The first electrode 41 has a laminated structure of ITO, thinned Ag, and ITO, and is light transparent. The second electrode 43 is a mixed layer of thickened Mg and Ag or a thickened aluminum film layer, has a thickness greater than the fourth electrode 33, and is opaque. For example, the second electrode 43 has a thickness in a range of 250 nm to 350 nm. With the second electrode 43 of such a thickness, a light-emitting rate of the light emitted from the bottom emission element 4 and reflected by the second electrode 43 is improved, thereby improving the light-emitting efficiency of the bottom emission element 4, and further reducing the difference in display brightness between the front and back surfaces of the display substrate.

In this embodiment, by providing the reflection reducing structure 10 on the side of the light-emitting unit facing away from the pixel driving circuit 2, and the orthographic projection of the reflection reducing structure 10 on the base 1 covering at least the orthographic projection of the effective light-emitting region of the bottom emission element 4 on the base 1, at least the reflectivity to ambient light of a region of the second electrode 43 corresponding to the effective light-emitting region on the front surface of the display substrate, and thus at least the reflectivity to ambient light of a region of the bottom emission element 4 corresponding to the effective light-emitting region on the front surface of the display substrate, can be reduced, so that the difference between a reflectivity to ambient light of the bottom emission element 4 and a reflectivity to light of the top emission element 3 on the front surface of the display substrate is reduced, thereby reducing the overall reflectivity of the front surface of the display substrate, improving or avoiding visible patterns on the front surface of the display substrate, and reducing the difference in display brightness between the front and back surfaces of the display substrate.

In some embodiments, the top emission element 3 and the bottom emission element 4 may be organic light-emitting diodes (OLEDs), quantum dot light-emitting diodes (QLEDs), micro light-emitting diodes (Micro LEDs) or mini light-emitting diodes (Mini LEDs) or the like.

In some embodiments, the reflection reducing structure 10 includes a first film layer 7 on a side of the second electrode 43 facing away from the first light-emitting functional layer 42, and the first film layer 7 correspondingly covers the effective light-emitting region of the bottom emission element 4.

In some embodiments, the first film layer 7 is made of a material including any one of MoOx with the element Ta added, MoOx with ZnO added, NbC with ZnO added, a black resin material, or a black photoresist material.

A first film layer 7 made of a material including MoOx with Ta added, MoOx with ZnO added, or NbC with ZnO added is a ceramic oxide film of which a blackening degree may be adjusted by adjusting a content of a trace element (such as Ta). Such a film typically has a high refractive index around 2.4 and an extinction coefficient around 0.77, and eliminates reflected light based the principle of interference extinction. It is found through experimental tests that the reflectivity of the ceramic oxide film to light is reduced to different degrees when the film is matched with metals (such as Mo, Al and the like). By providing the first film layer 7 on an aluminum second electrode 43, a total surface reflectivity to light with a wavelength of 550 nm of the region of the second electrode 43 corresponding to the effective light-emitting region can be reduced to 0.88%, which greatly reduces the reflectivity to ambient light of the aluminum second electrode 43. In addition, a first film layer 7 made of a light-shielding black material, such as a black resin material or a black photoresist material, may be formed on the aluminum second electrode 43, and the black resin material or black photoresist material has an OD value (absorbance) $\geq 3$. Due to the strong light-absorbing capability of the light-shielding black material, ambient light irradiated on the first film layer is absorbed, so that the reflectivity to the ambient light irradiated on the second electrode 43 on the front surface of the display substrate is reduced.

In some embodiments, referring to FIG. 5, the top emission element 3 is adjacent to the bottom emission element 4; a display region of the top emission element 3 has a maximum viewing angle θ; the first film layer 7 is in contact with the second electrode 43, an orthographic projection of the first film layer 7 on the base 1 falls into an orthographic projection of the second electrode 43 on the base 1, and an orthographic projection of the first film layer 7 on the base 1 has an area smaller than the orthographic projection of the second electrode 43 on the base 1; a distance d is provided between orthographic projections of the first film layer 7 and a side edge of the second electrode 43 close to the top emission element 3 on the base 1, and the first film layer 7 reaches a lowest reflectivity at a thickness "a"; and θ and d satisfy the following equation:

$$\tan(90° - \theta/2) = a/d, \qquad \text{equation (1)}$$

where $120° \leq \theta < 180°$.

In the case where the maximum viewing angle θ of the display region of the top emission element 3 and the thickness a of the first film layer 7 for the lowest reflectivity are determined, the distance "d" between an orthographic projection of the first film layer 7 on the base 1 and an orthographic projection of the side edge of the second electrode 43 close to the top emission element 3 on the base 1 may be calculated from the above equation (1). The above setting of the distance "d" can ensure that the display viewing angle range of the top emission element 3 on the front surface of the display substrate is not shielded by the first film layer 7, thereby ensuring normal front display of the display substrate.

In some embodiments, "a" is in a range of 1500 nm to 2500 nm; and "d" is in a range of 2600 nm to 4500 nm.

In some embodiments, according to simulation, when the reflectivity to ambient light of the bottom emission region on the front surface of the display substrate is reduced to be close to that of the top emission region, the second electrode 43 has a thickness in a range of 250 nm to 350 nm, the first film layer 7 has a thickness in a range of 1500 nm to 2500 nm, and $(90° - \theta/2) \leq 30°$, and after calculation, the distance "d" between an orthographic projection of the first film layer 7 on the base 1 and an orthographic projection of the side edge of the second electrode 43 close to the top emission element 3 on the base 1 is in a range of 2600 nm to 4500 nm, and a pixel defining layer 6 between a top emission element 3 and an adjacent bottom emission element 4 has a width of about 22 μm.

Figure 6:
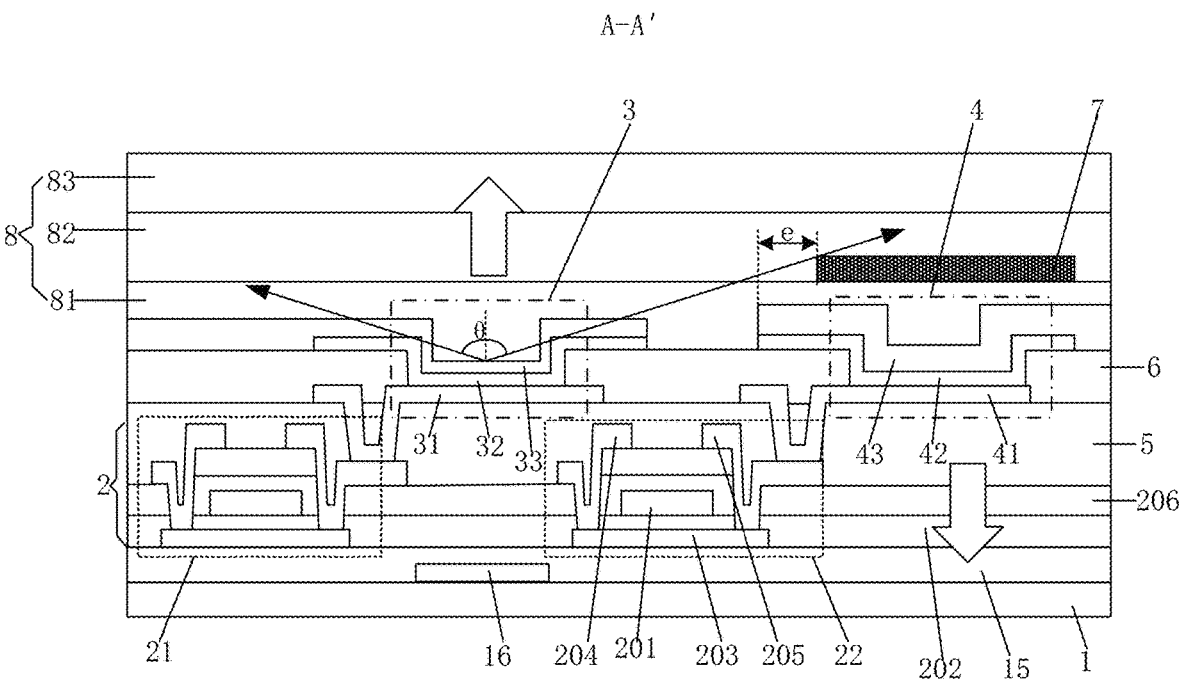
FIG. 6 is another structural sectional view of a display substrate taken along line AA' in FIG. 4 according to an embodiment of the present disclosure.

In some embodiments, referring to FIG. 6, another structural sectional view of a display substrate along line AA' in FIG. 4 according to an embodiment of the present disclosure is shown. The display substrate further includes a package layer 8 on a side of the light-emitting unit facing away from the pixel driving circuit 2. The package layer 8 includes a first inorganic layer 81, an organic layer 82 and a second inorganic layer 83 which are sequentially stacked in a direction away from the light-emitting unit. The first film layer 7 is located on a side of the first inorganic layer 81 facing away from the second electrode 43, and a side of the organic layer 82 close to the first inorganic layer 81. The first film layer 7 correspondingly covers the effective light-emitting region of the bottom emission element 4.

The first film layer 7 is located on and in contact with the first inorganic layer 81. The first inorganic layer 81 and the second inorganic layer 83 are made of silicon oxide, silicon nitride, or the like. The organic layer 82 is made of an organic resin material. If a first film layer 7 made of a ceramic oxide material is used, interference elimination of the reflected ambient light on the first film layer 7 may be implemented by adjusting a refractive index of the first inorganic layer 81 to be matched with that of the first film layer 7, so that the reflectivity to the ambient light irradiated on the second electrode 43 on the front surface of the display substrate is reduced. If a first film layer 7 made of a black resin material or black photoresist material is used, ambient light irradiated on the first film layer is absorbed due to the strong light-absorbing capability of the light-shielding black material, so that the reflectivity to the ambient light irradiated on the second electrode 43 on the front surface of the display substrate is reduced.

In some embodiments, referring to FIG. 6, the top emission element 3 is adjacent to the bottom emission element 4; a display region of the top emission element 3 has a maximum viewing angle θ; an orthographic projection of the first film layer 7 on the base 1 falls into an orthographic projection of the second electrode 43 on the base 1, and an orthographic projection of the first film layer 7 on the base 1 has an area smaller than the orthographic projection of the second electrode 43 on the base 1; a distance "e" is provided between orthographic projections of the first film layer 7 and a side edge of the second electrode 43 close to the top emission element 3 on the base 1; the first film layer 7 reaches a lowest reflectivity at a thickness a; the first inorganic layer 81 has a thickness "b"; and θ and e satisfy the following equation:

$$\tan(90° - \theta/2) = (a + b)/e, \qquad \text{equation (2)}$$

where $120° \leq \theta < 180°$.

Figure 7:
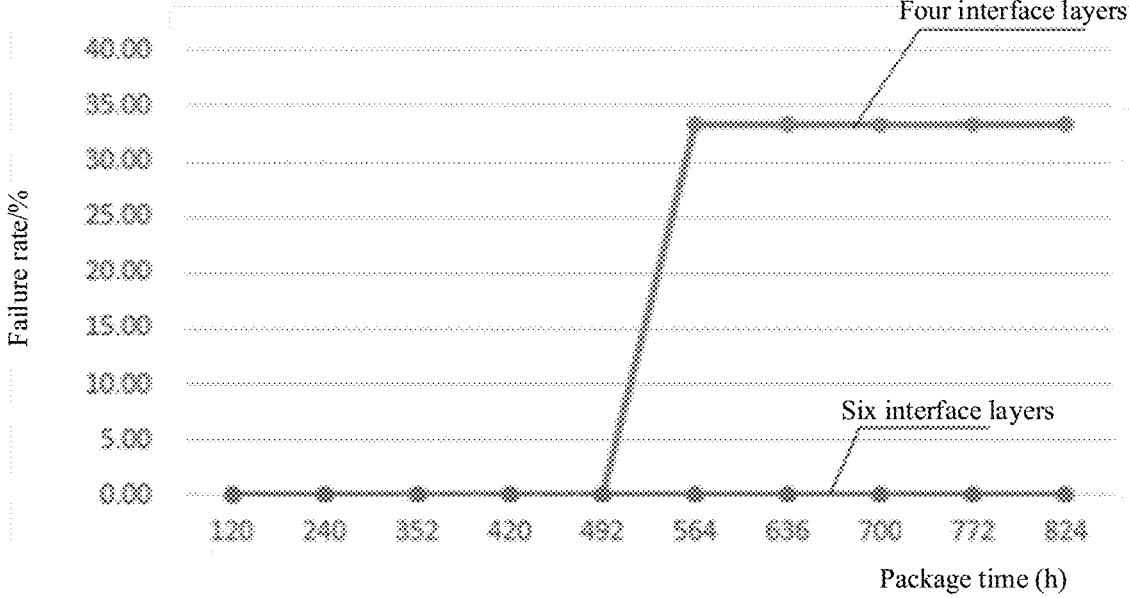
FIG. 7 is a graph showing a correspondence relationship between the number of interface layers in the package layer and the package failure rate.

In the case where the maximum viewing angle θ of the display region of the top emission element 3 and the thickness (a+b) at which refractive indexes of the first film layer 7 and the first inorganic layer 81 are matched to reach the lowest reflectivity are determined, the distance e between orthographic projections of the first film layer 7 and the side edge of the second electrode 43 close to the top emission element 3 on the base 1 may be calculated from the above equation (2). The above setting of the distance e can ensure that the display viewing angle range of the top emission element 3 on the front surface of the display substrate is not shielded by the first film layer 7, thereby ensuring normal front display of the display substrate. Further, the thickness of the first film layer 7 may be adjusted by adjusting the thickness of the first inorganic layer 81, so that the thickness of the first film layer 7 can be adjusted while ensuring reliability of the first inorganic layer 81. In addition, another advantage of the structure in which the first film layer 7 is stacked on the first inorganic layer 81 lies in that: introducing the design of the first film layer 7 is equivalent to increasing the number of interface layers in the package layer 8, which elongates invasion path of water vapor, and can further increase packaging reliability of the light-emitting unit. Referring to FIG. 7, a graph showing a correspondence relationship between the number of interface layers in the package layer and the package failure rate is shown. In FIG. 7, the abscissa represents package time; and the ordinate represents package failure rates in percentages. It can be seen from FIG. 7 that as the number of package interface layers of the display substrate increases, the package failure rate decreases, thereby ensuring reliability of the display substrate package.

In some embodiments, a is in a range of 1500 nm to 2500 nm; and e is in a range of 2946 to 4700 nm.

In some embodiments, according to simulation, when the reflectivity to ambient light of the bottom emission region on the front surface of the display substrate is reduced to be close to that of the top emission region, the second electrode 43 has a thickness in a range of 250 nm to 350 nm, the first film layer 7 has a thickness in a range of 1500 nm to 2500 nm, and $(90° - \theta/2) \leq 30°$, and by calculation with the second electrode 43 having an actual experimental thickness of 300 nm, the distance e between orthographic projections of the first film layer 7 and the side edge of the second electrode 43 close to the top emission element 3 on the base 1 is in a range of 2946 nm to 4700 nm, and a pixel defining layer 6 between a top emission element 3 and an adjacent bottom emission element 4 has a width of about 22 μm.

Figure 8:
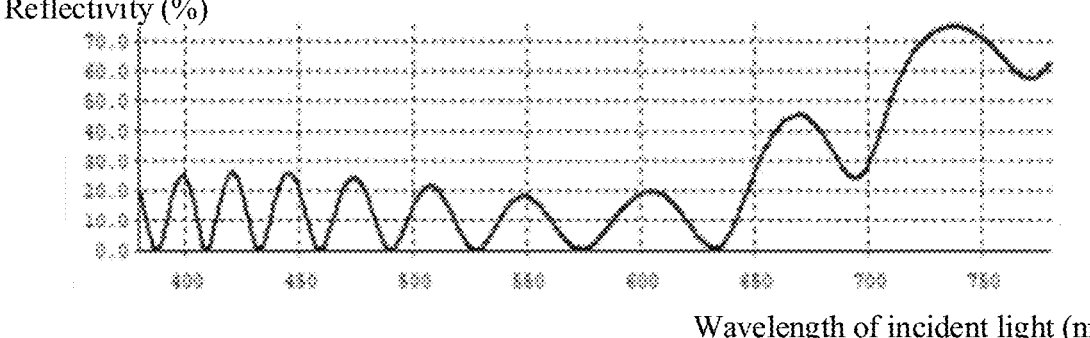
FIG. 8 is a graph showing reflectivity to different wavelengths of light of a bottom emission region on a front surface of a display substrate with the above structure according to an embodiment of the present disclosure.

Referring to FIG. 8, a graph showing reflectivity to different wavelengths of light of a bottom emission region on a front surface of a display substrate with the above structure according to an embodiment of the present disclosure is shown. According to simulation, the reflectivity of the bottom emission region on the front surface of the display substrate to the ambient light with a wavelength of 550 nm may be reduced to 24.95%, which is close to the reflectivity 24.46% of the top emission region on the front surface of the display substrate, so that the display substrate with the above structure in the embodiment of the present disclosure improves the problems of a high overall reflectivity and visible patterns on the front surface.

Figure 9:
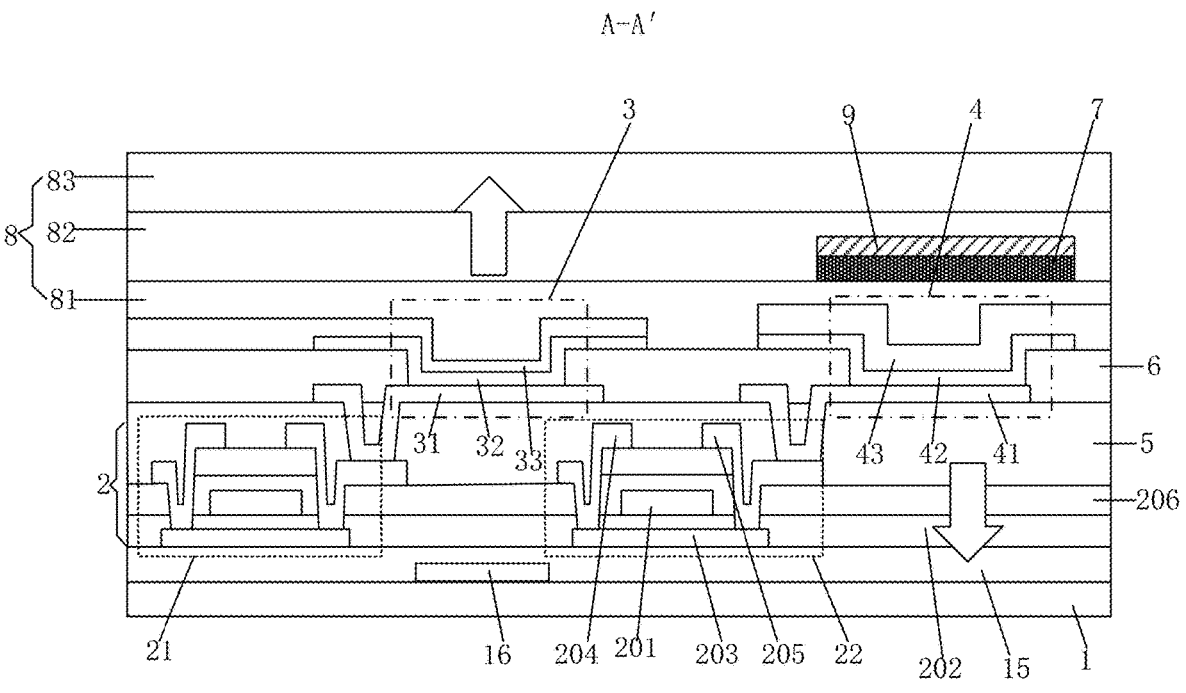
FIG. 9 is yet another structural sectional view of a display substrate taken along line AA' in FIG. 4 according to an embodiment of the present disclosure.

In some embodiments, referring to FIG. 9, yet another structural sectional view of a display substrate taken along line AA' in FIG. 4 according to an embodiment of the present disclosure is shown, in which the reflection reducing structure 10 further includes a second film layer 9 on a side of the first film layer 7 facing away from the light-emitting unit, on the basis of the display substrate structure shown in FIG. 5 and/or FIG. 6, and the second film layer 9 correspondingly covers the effective light-emitting region of the bottom emission element 4.

In some embodiments, the second film layer 9 is in contact with the first film layer 7.

In some embodiments, the second film layer may be not in contact with the first film layer (not shown). In other words, another film layer may be provided between the second film layer and the first film layer for separation.

In some embodiments, the second film layer 9 is made of a material including a black resin material or a black photoresist material. When the first film layer 7 is made of a material including MoOx with Ta added, MoOx with ZnO added, or NbC with ZnO added, the second film layer 9 can further absorb the ambient light irradiated thereon while the first film layer 7 reduces the reflectivity to ambient light of the second electrode 43 based on the principle of interference extinction, thereby further reducing the reflectivity to ambient light of the second electrode 43. When the first film layer 7 is made of a black resin material or black photoresist material, the second film layer 9 can further absorb the ambient light irradiated thereon while the first film layer 7 reduces the reflectivity to ambient light of the second electrode 43 based on the principle of light absorption, thereby further reducing the reflectivity to ambient light of the second electrode 43.

Referring to FIG. 9, on the basis of the display substrate structure shown in FIG. 6, the reflection reducing structure 10 further includes a second film layer 9. Meanwhile, referring to the graph showing a correspondence relationship between the number of interface layers in the package layer and the package failure rate in FIG. 7, the reflection reducing structure 10 composed of the first film layer 7 and the second film layer 9 in FIG. 9 is disposed on the first inorganic layer 81, which is equivalent to further increasing the number of interface layers in the package layer 8, and thus further elongates invasion path of water vapor. As the number of package interface layers of the display substrate increases, the package failure rate decreases, and the provision of the reflection reducing structure 10 in FIG. 9 can further increase packaging reliability of the light-emitting unit, thereby further ensuring reliability of the display substrate package.

Figure 10:
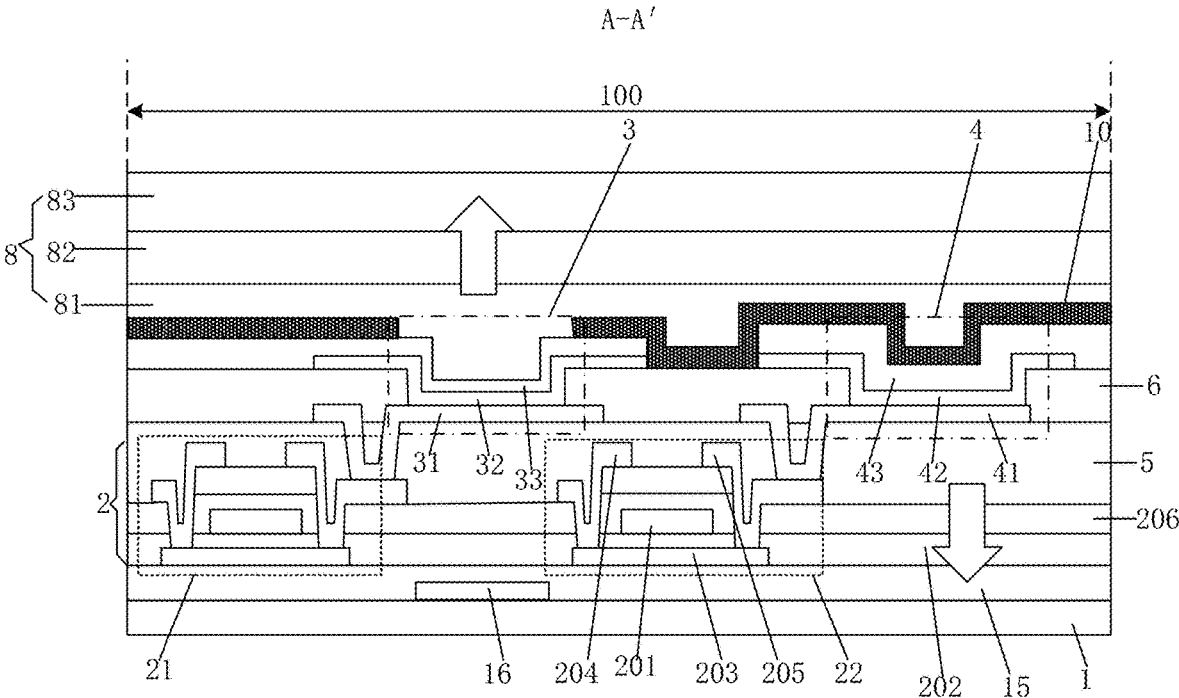
FIG. 10 is yet another structural sectional view of a display substrate taken along line AA' in FIG. 4 according to an embodiment of the present disclosure.

In some embodiments, referring to FIG. 10, yet another structural sectional view of a display substrate taken along line AA' in FIG. 4 according to an embodiment of the present disclosure is shown. The display substrate includes a display region 100 where the light-emitting unit is located. The display substrate further includes a pixel defining layer 6 on a side of the pixel driving circuit 2 facing away from the base 1. A plurality of openings are formed in the pixel defining layer 6, and the top emission element 3 and the bottom emission element 4 are respectively located in different openings. An orthographic projection of the reflection reducing structure 10 on the base 1 covers all regions in the display region 100 except the opening where the top emission element 3 is located. With such arrangement, the entire display region 100 on the front surface of the display substrate except the top emission region is covered by the reflection reducing structure 10, so that the reflectivity to ambient light of the entire display region 100 on the front surface of the display substrate except the top emission region is greatly reduced, and regions on the front surface of the display substrate other than the top emission region are ensured to have a reflectivity to ambient light close to the top emission region. As a result, it is ensured that the reflection of the ambient light by other regions on the front surface of the display substrate than the top emission region will not affect display of display substrate, for example, visible patterns on the front surface of the display substrate due to a great different in reflectivity among different regions are avoided, and finally normal display on the front surface of the display substrate is ensured.

Figure 11:
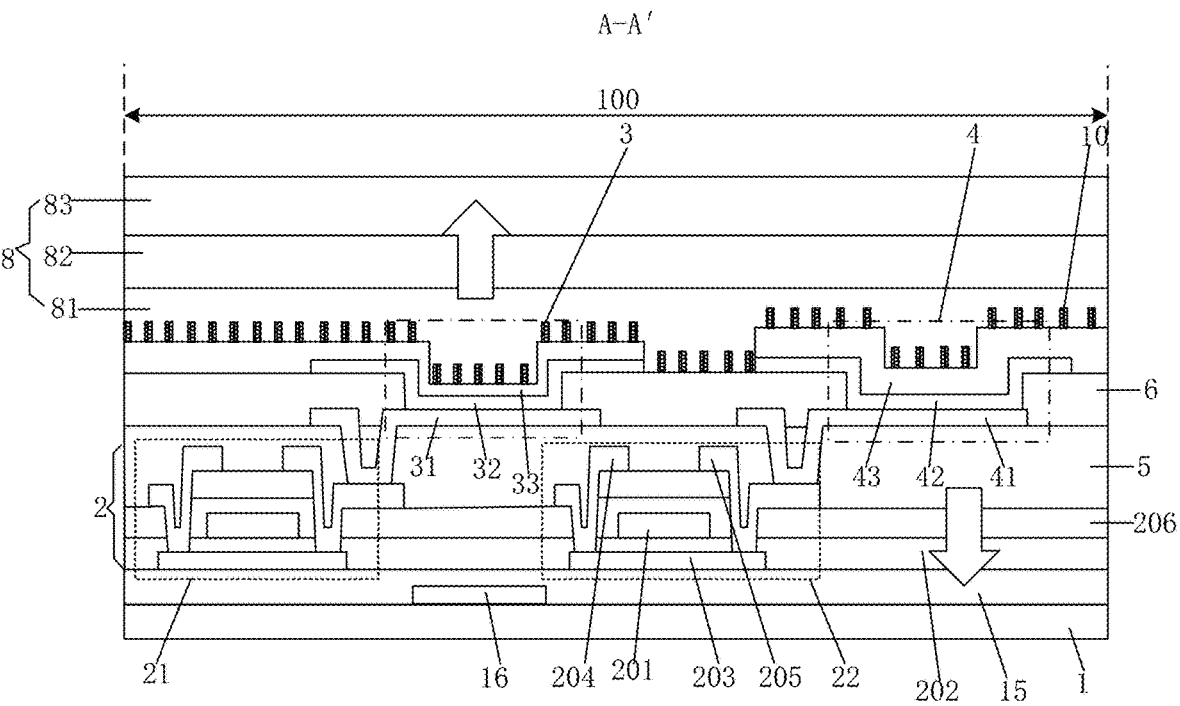
FIG. 11 is yet another structural sectional view of a display substrate taken along line AA' in FIG. 4 according to an embodiment of the present disclosure.

In some embodiments, referring to FIG. 11, yet another structural sectional view of a display substrate along line AA' in FIG. 4 according to an embodiment of the present disclosure is shown. The display substrate includes a display region 100 where the light-emitting unit is located. The reflection reducing structure 10 has a grid shape. An orthographic projection of the reflection reducing structure 10 on the base 1 covers the entire display region 100. The grid of the reflection reducing structure 10 has a size much smaller than an area of the effective light-emitting region of the top emission element 3 or the bottom emission element 4, so that the grid-shaped reflection reducing structure 10 is hardly visible when the front display of the display substrate is viewed by naked eyes. With such arrangement, the display region 100 on the front surface of the display substrate is completely covered by the grid-shaped reflection reducing structure 10 which, on one hand, enables normal emission of display light from the top emission region on the front surface of the display substrate, and thus ensures normal display of the top emission region on the front surface of the display substrate; and on the other hand, greatly reduces the reflectivity to ambient light of the entire display region 100 on the front surface of the display substrate, and makes the reduced reflectivity of different regions in the display region 100 on the front surface of the display substrate tend to be consistent, so that the reflectivity to ambient light of different regions in the display region 100 on the front surface of the display substrate tends to be consistent, visible patterns on the front surface of the display substrate due to a great different in reflectivity among different regions are avoided, and finally normal display on the front surface of the display substrate is ensured. Meanwhile, since a display substrate capable of double-sided display typically has a higher display brightness on the front surface (i.e., a top emission display brightness) than on the back surface (i.e., a bottom emission display brightness), the difference in display brightness between the front and back surfaces of the display substrate can be further reduced through provision of the reflection reducing structure 10, and thus, the consistency in display brightness on the front and back surfaces of the display substrate can be further improved. The reflection reducing structure 10 shown in FIGS. 10 and 11 is made of a material including any one of MoOx with Ta added, MoOx with ZnO added, NbC with ZnO added, a black resin material, or a black photoresist material.

In some embodiments, referring to FIG. 4, a plurality of top emission elements 3 are provided; a plurality of bottom emission element 4 are provided; the plurality of top emission elements 3 are arranged adjacent to each other to form a top emission pixel 11; one or more top emission pixels 11 are arranged adjacent to each other to form a top emission unit 12; the plurality of bottom emission elements 4 are arranged adjacent to each other to form a bottom emission pixel 13; one or more bottom emission pixels 13 are arranged adjacent to each other to form a bottom emission unit 14; top emission units 12 and bottom emission units 14 are alternately arranged in an array along a first direction X and a second direction Y, respectively; and the first direction X is a row direction of the array, and the second direction Y is a column direction of the array. With such arrangement, uniform display on the front and back surfaces of the display substrate is implemented, while the display brightness tends to be consistent on the front and back surfaces of the display substrate, thereby improving the display effect on the front and back surfaces of the display substrate.

In FIG. 4, the display with the reflection reducing structure 10 is on the back surface of the display substrate, while the display without the reflection reducing structure is on the front surface of the display substrate. The reflection reducing structure 10 has a flat plane structure or a grid structure, should be a black block in the top view. However, in order to better distinguish the top emission unit 12 on the front surface and the bottom emission unit 14 on the back surface, the reflection reducing structure 10, the third electrode 31 of the top emission element 3, and the first electrode 41 of the bottom emission element 4 are represented as boxes which indicate extending edges of the reflection reducing structure 10, the third electrode 31 of the top emission element 3, and the first electrode 41 of the bottom emission element 4. As can be seen from FIG. 4, orthographic projections of effective light-emitting regions of the top emission element 3 and the bottom emission element 4 on the base 1 each have a hexagonal or pentagonal shape, an orthographic projection of the third electrode 31 of the top emission element 3 on the base 1 has an area larger than the effective light-emitting region of the top emission element 3, and the orthographic projection of the third electrode 31 of the top emission element 3 on the base 1 covers the effective light-emitting region of the top emission element 3. Orthographic projections of the reflection reducing structure 10 and the first electrode 41 of the bottom emission element 4 on the base 1 have an area larger than the effective light-emitting region of the bottom emission element 4, and the orthographic projections of the reflection reducing structure 10 and the first electrode 41 of the bottom emission element 3 on the base 1 cover the effective light-emitting region of the bottom emission element 4. The pixel defining layer 6 covers regions other than a region where the hexagon or pentagon is located, and edges of the hexagon or pentagon represent extending edges of the pixel defining layer 6. A distance f from an edge of the reflection reducing structure 10 to an edge of the pixel defining layer 6 is about 8 μm (which, in subsequent mass production, can be optimized according to a spatial dimension of the mass production project).

In some embodiments, the display substrate further includes a buffer layer 15 and a light-shielding layer 16. The buffer layer 15 is disposed on the base 1 and located on a side of the pixel driving circuit 2 close to the base 1. The light-shielding layer 16 is disposed between the buffer layer 15 and the base 1, and has an orthographic projection on the base 1 that covers the effective light-emitting region of the top emission element 3. The light-shielding layer 16 can shield stray light irradiated onto the third electrode 31 of the top emission element 3, so as to prevent the stray light from interfering with or affecting the light-emitting performance of the top emission element 3. In some embodiments, the light-shielding layer 16 is made of an opaque metal material.

Based on the above structure of the display substrate, an embodiment of the present disclosure further provides a method for preparing a display substrate, including: sequentially preparing a pixel driving circuit and a light-emitting unit on a base, where preparing the light-emitting unit includes preparing a top emission element and a bottom emission element, and orthographic projections of the top emission element and the bottom emission element on the base do not overlap with each other. The method further includes: preparing a reflection reducing structure after the light-emitting unit is prepared, where an orthographic projection of the reflection reducing structure on the base covers at least the orthographic projection of the effective light-emitting region of the bottom emission element on the base.

In some embodiments, taking a display substrate having the structures shown in FIGS. 5 and 6 as an example, preparing the reflection reducing structure includes preparing a first film layer, where the first film layer is made of a material including MoOx with Ta added, MoOx with ZnO added, or NbC with ZnO; and preparing the first film layer includes the following steps S01 to S03. At step S01, a pattern of a sacrificial layer is formed on the base on which the light-emitting unit or the first inorganic layer has been prepared, where the pattern of the sacrificial layer correspondingly covers other regions than the effective light-emitting region of the bottom emission element.

At step S02, a film for forming the first film layer is deposited on the base after the above steps are completed.

At step S03: after the above steps are completed, the base is soaked in a stripping liquid to separate the sacrificial layer from a film layer attached to the sacrificial layer and form a pattern of the first film layer, where the pattern of the first film layer correspondingly covers the effective light-emitting region of the bottom emission element.

In the above preparation method, the first film layer is prepared through a stripping process.

In some embodiments, taking a display substrate having the structures shown in FIGS. 5 and 6 as an example, preparing the reflection reducing structure includes preparing a first film layer, where the first film layer is made of a material including MoOx with Ta added, MoOx with ZnO added, or NbC with ZnO; and preparing the first film layer includes the following steps S01' and S02'. At step S01', a film for forming the first film layer is deposited on the base on which the light-emitting unit or the first inorganic layer is prepared.

At step S02', a pattern of the first film layer is formed through processes including photoresist coating, exposure, development and etching, where the pattern of the first film layer correspondingly covers the effective light-emitting region of the bottom emission element.

In the above preparation method, the first film layer is prepared through a patterning process. Details of the patterning process are omitted herein.

In some embodiments, taking a display substrate having the structures shown in FIGS. 5 and 6 as an example, preparing the reflection reducing structure includes preparing a first film layer, where the first film layer is made of a material including a black resin material or a black photoresist material; and preparing the first film layer includes the following steps S01" and S02". At step S01", a film for forming the first film layer is formed, by coating, on the base on which the light-emitting unit or the first inorganic layer is prepared.

At step S02", a pattern of the first film layer is formed through processes including exposure and development, where the pattern of the first film layer correspondingly covers the effective light-emitting region of the bottom emission element.

In the above preparation method, a first film layer made of a black resin material or black photoresist material is prepared through a patterning process. Details of the patterning process are omitted herein.

In some embodiments, taking a display substrate having the structures shown in FIG. 9 as an example, preparing the reflection reducing structure further includes preparing a second film layer, where the second film layer is made of a material including a black resin material or a black photoresist material; and preparing the second film layer includes the following steps S04 and S05. At step S04, a film for forming the second film layer is formed, by coating, on the base on which the first film layer is prepared.

At step S05, a pattern of the second film layer is formed through processes including exposure and development, where the pattern of the second film layer correspondingly covers the effective light-emitting region of the bottom emission element.

In the above preparation method, a second film layer made of a black resin material or black photoresist material is prepared through a patterning process. Details of the patterning process are omitted herein.

In some embodiments, the reflection reducing structure in the display substrate having the structures shown in FIGS. 10 and 11 may be prepared through any one of the above preparation processes. For example, when the reflection reducing structure is made of a material including MoOx with Ta added, MoOx with ZnO added, or NbC with ZnO added, the reflection reducing structure may be prepared through a stripping process or patterning process. When the reflection reducing structure is made of a black resin material or black photoresist material, the reflection reducing structure may be prepared through a patterning process.

According to the display substrate in the embodiments of the present disclosure, by providing the reflection reducing structure on the side of the light-emitting unit facing away from the pixel driving circuit 2, and the orthographic projection of the reflection reducing structure on the base 1 covering at least the orthographic projection of the effective light-emitting region of the bottom emission element 4 on the base 1, at least the reflectivity to ambient light of a region of the second electrode 43 corresponding to the effective light-emitting region on the front surface of the display substrate, and thus at least the reflectivity to ambient light of a region of the bottom emission element 4 corresponding to the effective light-emitting region on the front surface of the display substrate, can be reduced, so that the difference between a reflectivity to ambient light of the bottom emission element 4 and a reflectivity to light of the top emission element 3 on the front surface of the display substrate, and thereby the overall reflectivity of the front surface of the display substrate, are reduced, visible patterns on the front surface of the display substrate are improved or avoided, the difference in display brightness between the front and back surfaces of the display substrate is reduced, and the double-sided display effect of the display substrate is improved.

In a second aspect, an embodiment of the present disclosure further provides a display device, including the display substrate in any of the above embodiments.

By adopting the display substrate in any of the above embodiments, the double-sided display of the display apparatus can be implemented on the one hand; and on the other hand, the reflectivity difference between the front and back surfaces of the display apparatus can be reduced, so that the difference in display brightness between the front and back surfaces of the display apparatus is reduced; and the double-sided display effect of the display apparatus is improved.

The display apparatus may be an OLED panel, an LED panel, a QLED panel, a Micro LED panel, a Mini LED panel, a television, a mobile phone, a tablet, a laptop, a monitor, a digital album, a navigator or any other product or component having a display function.

It will be appreciated that the above implementations are merely exemplary implementations for the purpose of illustrating the principle of the present disclosure, and the present disclosure is not limited thereto. It will be apparent to one of ordinary skill in the art that various modifications and variations may be made without departing from the spirit or essence of the present disclosure. Such modifications and variations should also be considered as falling into the protection scope of the present disclosure.

What is claimed is:

1. A display substrate, comprising: a base;
a pixel driving circuit and a light-emitting unit sequentially stacked on the base; wherein
the light-emitting unit comprises a top emission element and a bottom emission element, the top emission element is configured to emit light from a side of the top emission element facing away from the pixel driving circuit, the bottom emission element is configured to emit light from a side of the bottom emission element close to the pixel driving circuit, orthographic projections of an effective light-emitting region of the top emission element and an effective light-emitting region of the bottom emission element on the base do not overlap with each other, and
the display substrate further comprises a reflection reducing structure on a side of the light-emitting unit facing away from the pixel driving circuit, and an orthographic projection of the reflection reducing structure on the base covers at least the orthographic projection of the effective light-emitting region of the bottom emission element on the base;
wherein the bottom emission element comprises a first electrode, a first light-emitting functional layer, and a second electrode which are sequentially stacked in a direction away from the pixel driving circuit, and
the reflection reducing structure comprises a first film layer on a side of the second electrode facing away from the first light-emitting functional layer, and the first film layer correspondingly covers the effective light-emitting region of the bottom emission element; and
the display substrate further comprises a package layer on a side of the light-emitting unit facing away from the pixel driving circuit, wherein the package layer comprises a first inorganic layer, an organic layer and a second inorganic layer which are sequentially stacked in a direction away from the light-emitting unit, and the first film layer is located on a side of the first inorganic layer facing away from the second electrode, and a side of the organic layer close to the first inorganic layer.

2. The display substrate according to claim 1, wherein the top emission element is adjacent to the bottom emission element, and a display region of the top emission element has a maximum viewing angle θ, an orthographic projection of the first film layer on the base falls into an orthographic projection of the second electrode on the base, and an orthographic projection of the first film layer on the base has an area smaller than the orthographic projection of the second electrode on the base, a distance e is provided between an orthographic projection of the first film layer on the base and an orthographic projection of a side edge of the second electrode close to the top emission element on the base, the first film layer reaches a lowest reflectivity at a thickness "a", and the first inorganic layer has a thickness b, and θ and e satisfy: tan $(90°−θ/2)=(a+b)/e$, where $120°≤θ<180°$.

3. The display substrate according to claim 2, wherein "a" is in a range of 1500 nm to 2500 nm, and e is in a range of 2946 nm to 4700 nm.

4. The display substrate according to claim 1, wherein the reflection reducing structure further comprises a second film layer on a side of the first film layer facing away from the light-emitting unit, and the second film layer correspondingly covers the effective light-emitting region of the bottom emission element.

5. The display substrate according to claim 4, wherein the second film layer is in contact with the first film layer.

6. The display substrate according to claim 4, wherein the second film layer is made of a material comprising a black resin material or a black photoresist material.

7. A method for preparing a display substrate, comprising:

sequentially preparing a pixel driving circuit and a light-emitting unit on a base, wherein the preparing the light-emitting unit comprises preparing a top emission element and a bottom emission element, and orthographic projections of the top emission element and the bottom emission element on the base do not overlap with each other, and the method further comprises: preparing a reflection reducing structure after the light-emitting unit is prepared, wherein an orthographic projection of the reflection reducing structure on the base covers at least the orthographic projection of the effective light-emitting region of the bottom emission element on the base, wherein the display substrate is the display substrate according to claim 4, and the preparing the reflection reducing structure comprises preparing a first film layer, and the preparing the first film layer comprises:

forming a pattern of a sacrificial layer on the base on which the light-emitting unit or the first inorganic layer has been prepared, wherein the pattern of the sacrificial layer correspondingly covers other regions than the effective light-emitting region of the bottom emission element, depositing a film for forming the first film layer on the base after the forming of the pattern of the sacrificial layer is completed, and soaking, after the forming of the pattern of the sacrificial layer and the depositing of the film for forming the first film layer are completed, the base in a stripping liquid, to separate the sacrificial layer from a film layer attached to the sacrificial layer and form a pattern of the first film layer, wherein the pattern of the first film layer correspondingly covers the effective light-emitting region of the bottom emission element, and the preparing the reflection reducing structure further comprises preparing a second film layer, and the preparing the second film layer comprises:

coating a film for forming the second film layer on the base on which the first film layer has been prepared, forming a pattern of the second film layer through processes comprising exposure and development, wherein the pattern of the second film layer correspondingly covers the effective light-emitting region of the bottom emission element.

8. The display substrate according to claim 1, comprising a display region where the light-emitting unit is located, wherein the display substrate further comprises a pixel defining layer on a side of the pixel driving circuit facing away from the base, the pixel defining layer is provided with a plurality of openings formed therein, and the top emission element and the bottom emission element are respectively located in different ones of the openings, and an orthographic projection of the reflection reducing structure on the base covers all regions in the display region except the opening where the top emission element is located.

9. The display substrate according to claim 1, comprising a display region where the light-emitting unit is located, wherein the reflection reducing structure has a grid shape, and an orthographic projection of the reflection reducing structure on the base covers the entire display region.

10. The display substrate according to claim 1, wherein the first film layer is made of a material comprising any one of MoOx with Ta added, MoOx with ZnO added, NbC with ZnO added, a black resin material, or a black photoresist material.

11. A display apparatus, comprising the display substrate according to claim 1.

12. A method for preparing the display substrate according to claim 1, comprising:

sequentially preparing a pixel driving circuit and a light-emitting unit on a base, wherein the preparing the light-emitting unit comprises preparing a top emission element and a bottom emission element, and orthographic projections of the top emission element and the bottom emission element on the base do not overlap with each other, and the method further comprises: preparing a reflection reducing structure after the light-emitting unit is prepared, wherein an orthographic projection of the reflection reducing structure on the base covers at least the orthographic projection of the effective light-emitting region of the bottom emission element on the base.

13. A method for preparing a display substrate, comprising:

sequentially preparing a pixel driving circuit and a light-emitting unit on a base, wherein the preparing the light-emitting unit comprises preparing a top emission element and a bottom emission element, and orthographic projections of the top emission element and the bottom emission element on the base do not overlap with each other, and the method further comprises: preparing a reflection reducing structure after the light-emitting unit is prepared, wherein an orthographic projection of the reflection reducing structure on the base covers at least the orthographic projection of the effective light-emitting region of the bottom emission element on the base, wherein the display substrate is the display substrate according to claim 1, and the preparing the reflection reducing structure comprises preparing a first film layer, and the preparing the first film layer comprises:

forming a pattern of a sacrificial layer on the base on which the light-emitting unit or the first inorganic layer has been prepared, wherein the pattern of the sacrificial layer correspondingly covers other regions than the effective light-emitting region of the bottom emission element, depositing a film for forming the first film layer on the base after the forming of the pattern of the sacrificial layer is completed, and soaking, after the forming of the pattern of the sacrificial layer and the depositing of the film for forming the first film layer are completed, the base in a stripping liquid, to separate the sacrificial layer from a film layer attached to the sacrificial layer and form a pattern of the first film layer, wherein the pattern of the first film layer correspondingly covers the effective light-emitting region of the bottom emission element.

14. A method for preparing a display substrate, comprising:

sequentially preparing a pixel driving circuit and a light-emitting unit on a base, wherein the preparing the light-emitting unit comprises preparing a top emission element and a bottom emission element, and orthographic projections of the top emission element and the bottom emission element on the base do not overlap with each other, and the method further comprises: preparing a reflection reducing structure after the light-emitting unit is prepared, wherein an orthographic projection of the reflection reducing structure on the base covers at least the orthographic projection of the effective light-emitting region of the bottom emission element on the base, wherein the display substrate is the display substrate according to claim 1, and the preparing the reflection reducing structure comprises preparing a first film layer, and the preparing the first film layer comprises:

depositing a film for forming the first film layer on the base on which the light-emitting unit or the first inorganic layer has been prepared, and forming a pattern of the first film layer through processes comprising photoresist coating, exposure, development and etching, wherein the pattern of the first film layer correspondingly covers the effective light-emitting region of the bottom emission element.

15. A method for preparing a display substrate, comprising:

sequentially preparing a pixel driving circuit and a light-emitting unit on a base, wherein the preparing the light-emitting unit comprises preparing a top emission element and a bottom emission element, and orthographic projections of the top emission element and the bottom emission element on the base do not overlap with each other, and the method further comprises: preparing a reflection reducing structure after the light-emitting unit is prepared, wherein an orthographic projection of the reflection reducing structure on the base covers at least the orthographic projection of the effective light-emitting region of the bottom emission element on the base, wherein the display substrate is the display substrate according to claim 1, and the preparing the reflection reducing structure comprises preparing a first film layer, and the preparing the first film layer comprises:

coating a film for forming the first film layer on the base on which the light-emitting unit or the first inorganic layer has been prepared, and forming a pattern of the first film layer through processes comprising exposure and development, wherein the pattern of the first film layer correspondingly covers the effective light-emitting region of the bottom emission element.

16. A display substrate, comprising: a base;

a pixel driving circuit and a light-emitting unit sequentially stacked on the base; wherein the light-emitting unit comprises a top emission element and a bottom emission element, the top emission element is configured to emit light from a side of the top emission element facing away from the pixel driving circuit, the bottom emission element is configured to emit light from a side of the bottom emission element close to the pixel driving circuit, orthographic projections of an effective light-emitting region of the top emission element and an effective light-emitting region of the bottom emission element on the base do not overlap with each other, and the display substrate further comprises a reflection reducing structure on a side of the light-emitting unit facing away from the pixel driving circuit, and an orthographic projection of the reflection reducing structure on the base covers at least the orthographic projection of the effective light-emitting region of the bottom emission element on the base;

wherein the bottom emission element comprises a first electrode, a first light-emitting functional layer, and a second electrode which are sequentially stacked in a direction away from the pixel driving circuit, and the reflection reducing structure comprises a first film layer on a side of the second electrode facing away from the first light-emitting functional layer, and the first film layer correspondingly covers the effective light-emitting region of the bottom emission element, wherein the top emission element is adjacent to the bottom emission element, and a display region of the top emission element has a maximum viewing angle $\theta$, the first film layer is in contact with the second electrode, an orthographic projection of the first film layer on the base falls into an orthographic projection of the second electrode on the base, and the orthographic projection of the first film layer on the base has an area smaller than that of the orthographic projection of the second electrode on the base, a distance d is provided between an orthographic projection of the first film layer on the base and an orthographic projection of a side edge of the second electrode close to the top emission element on the base, and the first film layer reaches a lowest reflectivity at a thickness "a", and $\theta$ and d satisfy: tan $(90° - \theta/2) = a/d$, where $120° \le \theta < 180°$.

17. The display substrate according to claim 16, wherein "a" is in a range of 1500 nm to 2500 nm, and d is in a range of 2600 nm to 4500 nm.

18. A display substrate, comprising: a base;

a pixel driving circuit and a light-emitting unit sequentially stacked on the base; wherein the light-emitting unit comprises a top emission element and a bottom emission element, the top emission element is configured to emit light from a side of the top emission element facing away from the pixel driving circuit, the bottom emission element is configured to emit light from a side of the bottom emission element close to the pixel driving circuit, orthographic projections of an effective light-emitting region of the top emission element and an effective light-emitting region of the bottom emission element on the base do not overlap with each other, and the display substrate further comprises a reflection reducing structure on a side of the light-emitting unit facing away from the pixel driving circuit, and an orthographic projection of the reflection reducing structure on the base covers at least the orthographic projection of the effective light-emitting region of the bottom emission element on the base, wherein the display substrate comprises a plurality of top emission elements each being the top emission element, and a plurality of bottom emission elements each being the bottom emission element, multiple ones of the top emission elements are arranged adjacent to each other to form a top emission pixel, and one or more top emission pixels are arranged adjacent to each other to form a top emission unit, multiple ones of the bottom emission elements are arranged adjacent to each other to form a bottom emission pixel, and one or more bottom emission pixels are arranged adjacent to each other to form a bottom emission unit, top emission units each being the top emission unit and bottom emission units each being the bottom emission unit are alternately arranged in an array along a first direction and a second direction, respectively, and the first direction is a row direction of the array, and the second direction is a column direction of the array.

* * * * *